US009179560B2

(12) United States Patent
Yoon et al.

(10) Patent No.: US 9,179,560 B2
(45) Date of Patent: Nov. 3, 2015

(54) BOARD BLOCK FOR VEHICLES

(75) Inventors: Chang Bae Yoon, Incheon (KR); Jeong Hun Lee, Incheon (KR); Ja Min Kim, Incheon (KR)

(73) Assignee: KOREA ELECTRIC TERMINAL CO., LTD., Incheon (KR)

( * ) Notice: Subject to any disclaimer, the term of this patent is extended or adjusted under 35 U.S.C. 154(b) by 181 days.

(21) Appl. No.: 13/879,235

(22) PCT Filed: Jun. 7, 2011

(86) PCT No.: PCT/KR2011/004158
§ 371 (c)(1),
(2), (4) Date: Apr. 12, 2013

(87) PCT Pub. No.: WO2012/057427
PCT Pub. Date: May 3, 2012

(65) Prior Publication Data
US 2013/0194763 A1 Aug. 1, 2013

(30) Foreign Application Priority Data

Oct. 25, 2010 (KR) ........................ 10-2010-0103974
Oct. 27, 2010 (KR) ........................ 10-2010-0105478
Nov. 30, 2010 (KR) ........................ 10-2010-0120762

(51) Int. Cl.
*H01R 12/00* (2006.01)
*H05K 1/00* (2006.01)
*H05K 5/00* (2006.01)
*B60R 16/023* (2006.01)
*H05K 7/02* (2006.01)

(52) U.S. Cl.
CPC .......... *H05K 5/0026* (2013.01); *B60R 16/0238* (2013.01); *H05K 7/026* (2013.01)

(58) Field of Classification Search
CPC .......... H01R 9/093; H01R 9/24; H04Q 1/142; H04Q 1/14; H04Q 1/141; G01R 11/04; G01R 35/04; H01L 23/473; H01L 2924/3011; H05K 7/142; H05K 7/1417; H05K 3/284; H05K 1/141; H05K 1/144; H05K 3/368; H05K 2201/10689; H05K 3/344; H05K 1/14; G06F 1/184; G06F 1/181; G06F 1/185; G06F 1/186
See application file for complete search history.

(56) References Cited

U.S. PATENT DOCUMENTS

| 5,478,244 | A | * | 12/1995 | Maue et al. | 439/76.2 |
| 5,658,165 | A | * | 8/1997 | Yokota | 439/495 |
| 5,668,700 | A | * | 9/1997 | Tagusa et al. | 361/779 |
| 5,764,487 | A | * | 6/1998 | Natsume | 361/775 |
| 5,777,850 | A | * | 7/1998 | Jakob et al. | 361/736 |
| 5,842,872 | A | * | 12/1998 | Hosler et al. | 439/63 |
| 5,877,944 | A | * | 3/1999 | Onizuka | 361/826 |

(Continued)

FOREIGN PATENT DOCUMENTS

| JP | 2006-187050 A | 7/2006 |
| JP | 2006-187053 A | 7/2006 |
| KR | 10-0955056 B1 | 4/2010 |

*Primary Examiner* — Hoa C Nguyen
*Assistant Examiner* — Xanthia C Cunningham
(74) *Attorney, Agent, or Firm* — Paratus Law Group, PLLC

(57) ABSTRACT

Disclosure relates to a board block for vehicles. A housing forms an outer appearance of the board block of the present invention. The housing includes a housing body and a housing cover. A interior space is formed in the housing body, and a first connection unit is formed at one side of an upper end of the housing body. The housing cover covers the upper end of the housing body and the first connection unit.

19 Claims, 9 Drawing Sheets

(56) References Cited

U.S. PATENT DOCUMENTS

| | | | |
|---|---|---|---|
| 5,967,831 A * | 10/1999 | Yamada et al. | 439/496 |
| 6,008,982 A * | 12/1999 | Smith | 361/624 |
| 6,220,876 B1 * | 4/2001 | Avila et al. | 439/76.2 |
| 6,292,370 B1 * | 9/2001 | Anderson et al. | 361/748 |
| 6,324,057 B1 * | 11/2001 | Baran et al. | 361/690 |
| 6,388,883 B1 * | 5/2002 | Serizawa et al. | 361/752 |
| 6,431,880 B1 * | 8/2002 | Davis et al. | 439/76.2 |
| 6,437,986 B1 * | 8/2002 | Koshiba | 361/752 |
| 6,515,228 B2 * | 2/2003 | Albert et al. | 174/525 |
| 6,599,135 B2 * | 7/2003 | Yamane | 439/76.2 |
| 6,634,892 B2 * | 10/2003 | Nakamura | 439/76.2 |
| 6,870,096 B2 * | 3/2005 | Suzuki et al. | 174/50 |
| 6,929,487 B1 * | 8/2005 | Raghavendra et al. | 439/76.1 |
| 7,001,187 B2 * | 2/2006 | Terunuma et al. | 439/76.2 |
| 7,442,052 B2 * | 10/2008 | Kinoshita et al. | 439/76.2 |
| 7,566,230 B2 | 7/2009 | Ozawa et al. | |
| 7,695,324 B2 * | 4/2010 | Diekmann | 439/721 |
| 8,177,581 B2 * | 5/2012 | Zeng | 439/567 |
| 8,257,097 B2 * | 9/2012 | Kawaguchi | 439/76.2 |
| 8,339,801 B2 * | 12/2012 | Tominaga et al. | 361/775 |
| 2001/0000763 A1 * | 5/2001 | Muramatsu | 439/74 |
| 2001/0021103 A1 * | 9/2001 | Takagi | 361/752 |
| 2002/0016093 A1 * | 2/2002 | Nakamura | 439/76.2 |
| 2002/0022388 A1 * | 2/2002 | Oda | 439/76.2 |
| 2003/0161092 A1 * | 8/2003 | Cho | 361/659 |
| 2003/0219998 A1 * | 11/2003 | Kakuta et al. | 439/76.2 |
| 2005/0136708 A1 * | 6/2005 | Shimoda et al. | 439/76.2 |
| 2005/0153583 A1 * | 7/2005 | Kawamura et al. | 439/76.2 |
| 2005/0174748 A1 * | 8/2005 | Kojima | 361/796 |
| 2005/0239343 A1 * | 10/2005 | Kashiwazaki | 439/709 |
| 2006/0141822 A1 | 6/2006 | Ozawa et al. | |
| 2007/0096278 A1 * | 5/2007 | Nakatsu et al. | 257/678 |
| 2008/0299798 A1 * | 12/2008 | Yoshida et al. | 439/76.2 |
| 2009/0046437 A1 * | 2/2009 | Hsieh et al. | 361/752 |
| 2009/0298310 A1 * | 12/2009 | Nakanishi et al. | 439/76.2 |
| 2010/0062644 A1 * | 3/2010 | Aekins et al. | 439/620.21 |
| 2010/0263915 A1 * | 10/2010 | Shiraiwa et al. | 174/252 |
| 2011/0039422 A1 * | 2/2011 | Muir et al. | 439/65 |
| 2011/0235290 A1 * | 9/2011 | Luhr et al. | 361/752 |

* cited by examiner

BOARD BLOCK FOR VEHICLES

CROSS REFERENCE TO PRIOR APPLICATION

This application is a National Stage Patent Application of PCT International Patent Application No. PCT/KR2011/004158 (filed on Jun. 7, 2011) under 35 U.S.C. §371, which claims priority to Korean Patent Application Nos. 10-2010-0103974 (filed on Oct. 25, 2010), 10-2010-0105478 (filed on Oct. 27, 2010) and 10-2010-0120762 (filed on Nov. 30, 2010) which are all hereby incorporated by reference in their entirety.

TECHNICAL FIELD

The present disclosure relates to a board block for vehicles. More particularly, embodiments of the present disclosure relate to a board block for vehicles in which a bent circuit board is installed to perform various functions necessary for a vehicle.

BACKGROUND ART

In vehicles, it is necessary to supply and control power to various electric components. In order to collectively supply and control power to various electric components in this way, boxes such as a junction box, a joint box, and a battery box are used. Such a box is configured by integrating components such as fuses and relays, and circuit boards.

In recent years, board blocks which are installed in one box or separately equipped with a function of a box are often used. Such a board block performs substantially the same function as that of one box.

A plurality of printed circuit boards are used in the board block, and the printed circuit boards are disposed generally parallel to each other. In order to dispose the printed circuit boards in parallel, the printed circuit boards should be electrically connected by wires or jumper pins. Further, a structure for fixing the printed circuit boards should be provided separately. Thus, the board block according to the related art is relatively large and has a number of components.

The overall size of the board block can be reduced by extending a terminal for coupling components inserted from the outside of the housing in parallel to surfaces of the printed circuit boards while disposing the printed circuit boards in parallel. Thus, the terminal installed in the printed circuit board to be used for the coupling of components should be bent at the right angle unlike a general one. Since the terminal is bent at the right angle, it has a shape different from that of an existing terminal and should be manufactured separately.

Further, since connection unit for electrical connections of printed circuit boards to the outside cannot but be situated at the same location on a lower surface of the housing in the conventional board block, high current circuit patterns should be formed relatively long in the printed circuit boards. Accordingly, significant amounts of heat are generated in the relatively long high current circuit patterns, and the overall size of the board block increases due to the long printed circuit boards.

Furthermore, if many components are installed around the printed circuit blocks in the board block, it is relatively difficult to dissipate heat generated in the printed circuit boards.

In addition, when a separately manufactured board block is mounted to a box, it is important to firmly fix the board block to the box while the board block is not moved with respect to the box. If the board block is moved with respect to the box, operational reliability of the board block deteriorates.

DISCLOSURE

Technical Problem

Therefore, embodiments of the present invention have been made in view of the above-mentioned problems, and an aspect of the present invention is to reduce the number of components constituting a board block and make the board block light, slim, short, and small.

It is another aspect of the present invention to provide a board block which employs existing common components.

It is still another aspect of the present invention to make locations of connection units for electrical connections of a board block to the outside different for a first area and a second area to reduce a length of a high current circuit pattern formed in a printed circuit board.

It is yet another aspect of the present invention to more easily install a printed circuit board having a first area and a second area within a housing.

It is a further aspect of the present invention to more uniformly spread heat from a printed circuit board including a metal layer and bent to have a first area and a second area at a predetermined angle to prevent heat from concentrating in some areas of the printed circuit board.

It is still a further aspect of the present invention to accurately maintain a bent state of a bent printed circuit board.

It is yet a further aspect of the present invention to install many components adjacent to a bent printed circuit board.

It is still a yet further aspect of the present invention to firmly fix a board block to a mounting space of a box when the board block is mounted to the box to be used.

Technical Solution

In accordance with an aspect of the present invention, there is provided a board block for vehicles, including: a housing having an interior space; a first printed circuit board installed in the interior space of the housing, having a first area and a second area formed to have a predetermined angle therebetween by a bending area, and having a metal layer formed of a metal; a first connection unit installed in the first area of the first printed circuit board, and opened to the outside of the housing for electrical connection of the first area of the first printed circuit board to the outside; and a second connection unit installed in the second area of the first printed circuit board and opened to the outside of the housing for electrical connection of the second area of the first printed circuit board to the outside.

In accordance with another aspect of the present invention, there is provided a board block for vehicles, including: a housing including a housing body having an interior space and a housing cover for shielding an upper end of the housing body; a first printed circuit board having a first area and a second area formed to have a predetermined angle therebetween by a bending area and having a metal layer formed of a metal, the second area being located in the interior space of the housing body; a first connection unit installed in the first area of the first printed circuit board to be coupled to a counterpart connector; and a second connection unit installed in the second area of the first printed circuit board to be coupled to a counterpart connector.

In accordance with still another aspect of the present invention, there is provided a board block for vehicles, including: a housing including a housing body having an interior space and a housing cover for shielding an upper end of the housing body; a first printed circuit board having a first area and a second area formed to have a predetermined angle therebetween by a bending area and located in the interior space of the housing body; a second printed circuit board facing the second area at a predetermined interval; a board mounting unit located between the first area and the second area of the first printed circuit board to secure an interval therebetween; a first connection unit installed in the first area of the first printed circuit board to be coupled to a counterpart connector; and a second connection unit a tip end of which faces in a direction in which a tip end of the first connection unit faces and which is coupled to a counterpart connector.

Advantageous Effects

The board block for vehicles according to the present invention has the following effects.

First, since one bent printed circuit board serves as substantially two printed circuit boards, the number of printed circuit boards can be reduced. Further, since components for connecting and fixing two printed circuit boards are not employed, the number of components can be reduced, making the board block light, slim, short, and small.

Since a first area and a second area of the printed circuit board form a predetermined angle according to the related art, existing general terminals can be installed in the printed circuit board, making it possible to lower manufacturing costs of the board block.

Further, since a first connection unit and a second connection unit installed in the first area and the second area of the printed circuit board bent to have a predetermined angle are situated at different locations, a length of a high current circuit pattern can be reduced, making it possible to minimizing heat emission.

Meanwhile, since the printed circuit board is divided into the first area and the second area and is bent such that the first area and the second area form a predetermined angle, the shape of a housing can be freely designed. That is, since the angle between the areas can be adjusted to correspond to the shape of the housing, a degree of freedom of design of the housing can increase.

Furthermore, since a metal layer is situated on the interior or exterior of the printed circuit board, heat can be more uniformly spread in the printed circuit board, making it possible to prevent the concentration of heat to a specific location of the printed circuit board and accordingly increase the durability of the printed circuit board. In particular, since positioning ribs have thin plate shapes, an area where a board mounting unit directly contacts the printed circuit board can be reduced, making it possible to easily dissipate heat.

In addition, since a bent state of the bent printed circuit board can be maintained by using the board mounting unit, installation locations of components related to the printed circuit board can be accurately set.

The board mounting unit includes a first body plate and a second body plate such that the first body plate and the second body plate are coupled to the first area and the second area of the bent printed circuit board, and various spaces are provided in the first body plate and the second body plate so that various components can be installed in the spaces. Thus, a relatively large number of components can be integrated and installed in the area of the bent printed circuit board, the printed circuit board can form one assembly to be supplied to a product assembly line.

Further, since spacer bosses protruding from a housing cover and coupling stoppers are attached to an inner surface of a mounting space of the box and mounting hooks are stopped by a coupling step of the box between the spacer bosses, the board block can be firmly fixed without being moved in the mounting space of the box, making it possible to increase operational reliability of the board block.

Furthermore, since spacer channels are formed on an inner surface of the housing cover corresponding to the spacer bosses such that body ribs of the housing body are positioned in the space channels, a thickness and a size of the housing cover can be made relatively small, reducing the overall size of the board block.

In addition, since apertures can be formed by the spacer bosses and the coupling stoppers between an outer surface of the housing cover and an inner surface of the mounting space of the box, heat generated by the board block can be discharged to the outside of the mounting space through the apertures, which improves heat the dissipating characteristics.

BRIEF DESCRIPTION OF THE DRAWINGS

The foregoing and other objects, features and advantages of the present invention will become more apparent from the following detailed description when taken in conjunction with the accompanying drawings in which.

BEST MODE

Mode for Invention

Figure 1:
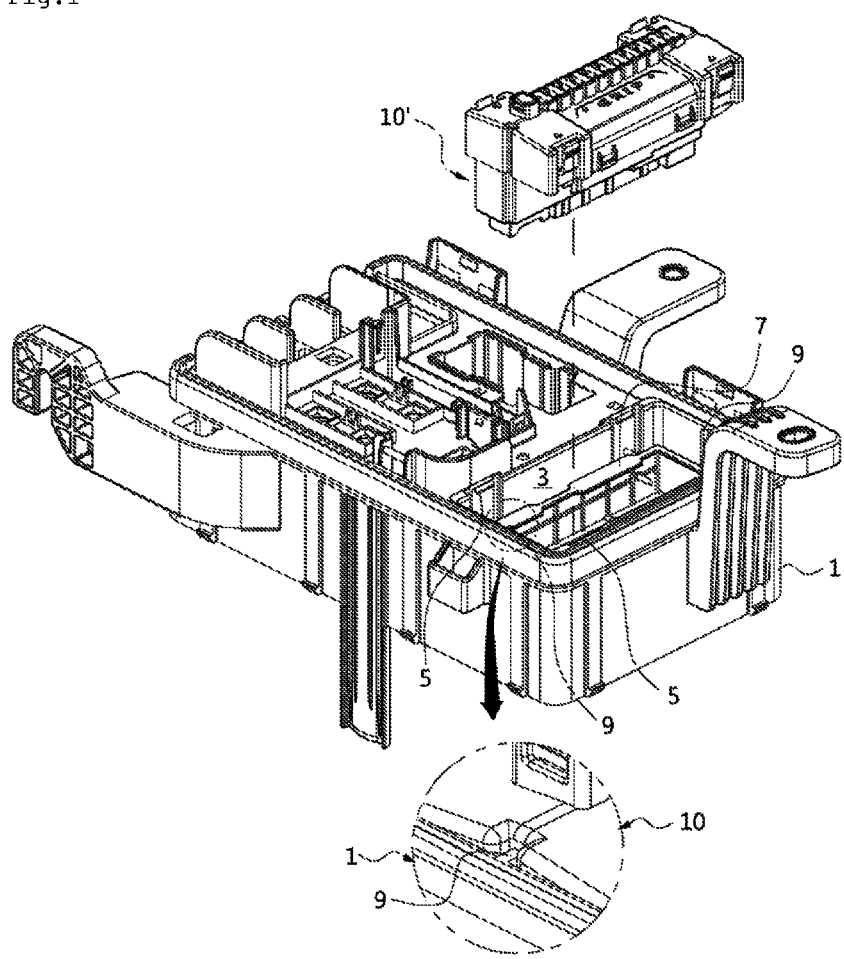
FIG. 1 is an exploded perspective view showing that a board block for vehicles according to an embodiment of the present invention is mounted to a box.

First, a box 1 to which a board block 10' is mounted will be described with reference to FIG. 1. The box 1 generally includes a main body 1' and upper and lower covers, and the main body 1' is shown in FIG. 1. A mounting space 3 vertically passes through the box 1. The board block 10' is inserted into and fixed to the mounting space 3.

To this end, a coupling step 5 is formed along a periphery of an entrance of the mounting space 3. The coupling step 5 protrudes on an inner surface of the mounting space 3. The coupling step 5 protrudes further than an inner peripheral surface of the mounting space 3 to be stopped by a stopping step 28' of a mounting hook 28, which will be described below.

A support step 7 is situated at a lower end of the inner surface of the mounting space 3. The support step 7 is formed along the inner surface of the mounting space 3, and is formed at a location where a lower end of a housing cover 20, which will be described below, can be positioned.

Guide ribs 9 are formed on opposite sides of the inner surface of the mounting space 3. The guide ribs 9 are formed long in a direction along which the board block 10' is inserted. The guide ribs 9 are located in guide channels 12' and 20', which will be described below. The locations and sizes of the guide ribs 9 may be differently determined to prevent the board block 10' not only from being inserted in the wrong direction but also from moving in the mounting space 3.

Next, the board block 10' will be described. A housing 10 forms the outer appearance and a frame of the board block 10'. The housing 10 includes a housing body 12 and a housing cover 20. The housing 10 may further include other components in addition to the housing body 12 and the housing cover 20. However, at least the housing body 12 and the housing cover 20 form the housing 10.

The guide channels 12' are grooved long on an outer surface of the housing body 12 in a direction along which the housing body 12 is inserted into the mounting space 3 of the box 1. The guide channels 12' are grooved on the outer surface of the housing body 12, and have a stepped shape rather than a grooved channel shape in the embodiment of the present invention. The guide channels 12' are formed at opposite ends of the housing body 12, and the locations thereof may be differently determined at the opposite ends of the housing body 12.

Figure 3:
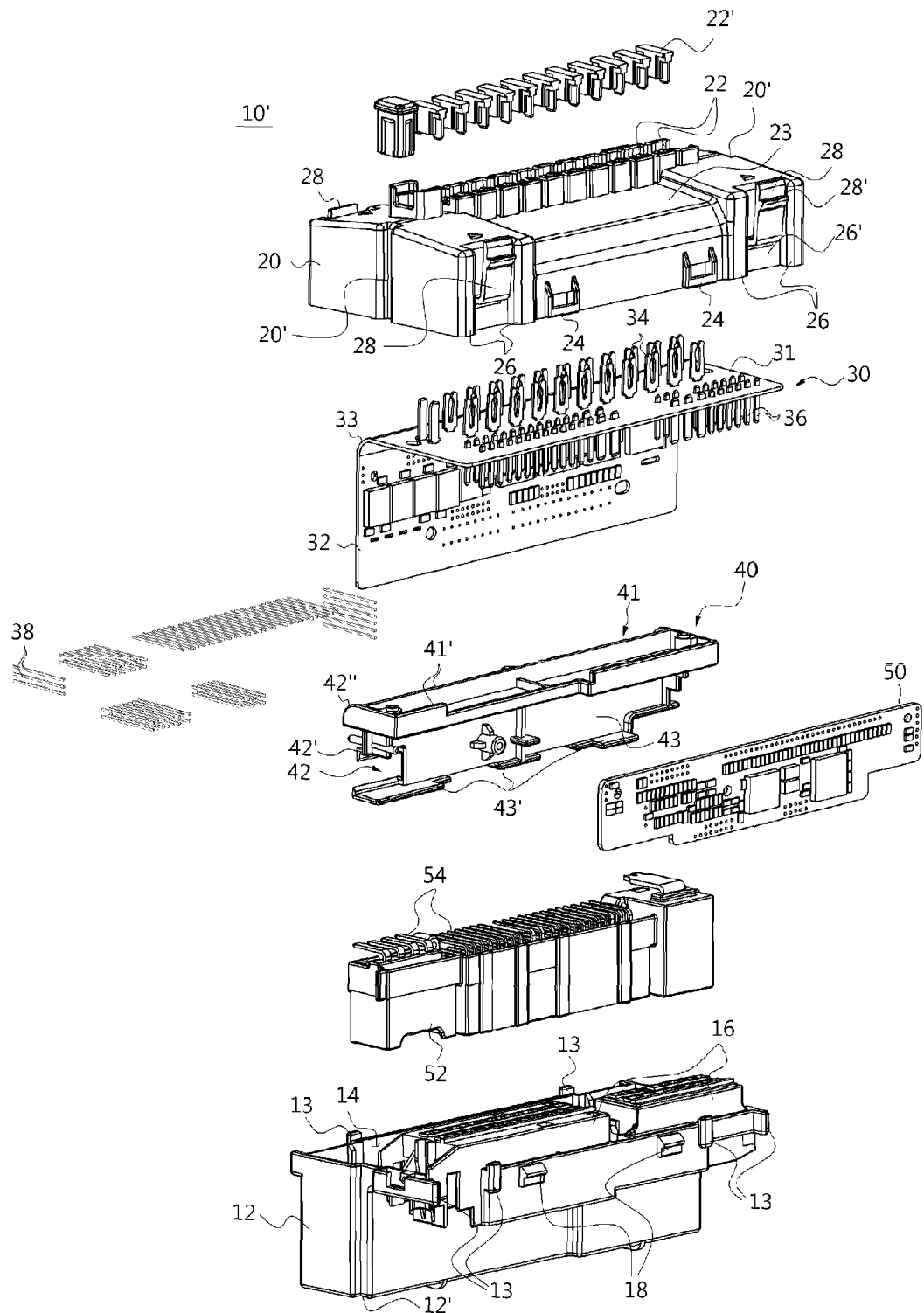
FIG. 3 is an exploded perspective view showing the board block for vehicles according to the embodiment of the present invention.

As shown in FIG. 3, a plurality of body ribs 13 are formed in the housing body 12. The body ribs 13 are formed around an upper end of an outer surface of the housing body 12. The body ribs 13 guide coupling of the housing 10 to the housing cover 20, and are positioned in spacer channels (see FIG. 5), which will be described below, and guide a coupling direction of the housing body 12 and the housing cover 20 to prevent relative movements thereof. Some of the body ribs 13 protrude further than an upper end of the housing body 12. This is done to make the coupling of the housing body 12 and the housing cover 20 more accurate and easier.

The housing body 12 has an interior space 14 having an open-topped hexahedron shape therein. A second area 32 of the first printed circuit board 30, which will be described below, and the second printed circuit board 50 are located in the interior space 14.

A first connection unit 16 is integrally formed at one side of the housing body 12. The first connection unit 16 is provided at one side of an upper end of the housing body 12, and an entrance of the first connection unit 16 is opened in a direction in which the interior space 14 is opened toward the lower side of the housing body 12.

Coupling bosses 18 for coupling of the housing 10 to the housing cover 20 protrude from an outer surface of an upper end of the housing body 12 and an outer surface of the first connection unit 16. A total of four coupling bosses 18 are formed in the embodiment of the present invention.

The housing cover 20 is installed so as to cover almost all portions of the upper end of the housing body 12 and a rear end of the first connection unit 16. An interior of the housing cover 20 is opened downward, and a first area 31 of the first printed circuit board 30, which will be described below, and the first connection unit 16 are located in the interior of the housing cover 20.

Guide channels 20' by which the guide ribs 9 of the box 1 are guided are grooved on opposite outer surfaces of the housing cover 20. The guide channels 20' are formed long along the insertion direction of the housing 10 at locations corresponding to the guide ribs 9. It is preferable that the surfaces of the housing cover 20 on which the guide channels 20' are formed are attached to the inner surface of the mounting space 3 of the box 1 or have no apertures.

A plurality of component installation units 22 formed in a row on the upper surface of the housing cover 20 in a lengthwise direction of the housing cover 20. In the embodiment of the present invention, fuses 22' are inserted into and installed in the component installation units 22. The component installation units 22 relatively protrude from the upper surface of the housing cover 20, and inclined surfaces 23 are formed on the upper surface of the housing cover 20 adjacent to the component installation units 22. The inclined surfaces 23 start from the component installation units 22 and are inclined downward as they go to opposite ends of the housing cover 20. In this way, as the inclined surfaces 23 are inclined downward as they go to the opposite ends of the housing cover 20, an operator can easily hold opposite side surfaces of the component installation units 22. Thus, the operator can hold the component installation units 22 with their hands to separate the housing cover 20 from the housing body 12.

Coupling stoppers 24 stopped by the coupling bosses 18 of the housing body 12 to couple the housing cover 20 and the housing body 12 are formed on opposite outer surfaces of the housing cover 20. In the embodiment of the present invention, the coupling stoppers 24 protrude from the opposite outer surfaces of the housing cover 20 and have a substantially U-shaped cross-section. However, this structure is not inevitably necessary, and the coupling stoppers may pass through opposite side surfaces of the housing cover 20 in the form of holes. It is preferable that the coupling stoppers 24 protrude by a distance by which spacer bosses 26, which will be described below, protrude. In this state, the coupling stoppers 24 may be attached to the inner surface of the mounting space 3.

A pair of space bosses 26 are formed long from an upper side to a lower side of the housing cover 20 on each of the opposite side surfaces of a front and rear lengthwise ends of the housing cover 20. The spacer bosses 26 protrude furthest from the outer surface of the housing cover 20 as compared with the other parts of the housing cover 20. When the board block 10' is mounted to the mounting space 3 of the box 1, the spacer bosses 26 are attached to the inner surface of the mounting space 3. The housing cover 20 is prevented from moving as the surfaces of the spacer bosses 26 are attached to the interior space of the box.

Recesses 26' are defined between the spacer bosses 26 to be recessed with respect to the spacer bosses 26. That is, the recesses 26' are recessed between the spacer bosses 26, and mounting hooks 28, which will be described below, are provided in the interiors of the recesses 26'.

Figure 5:
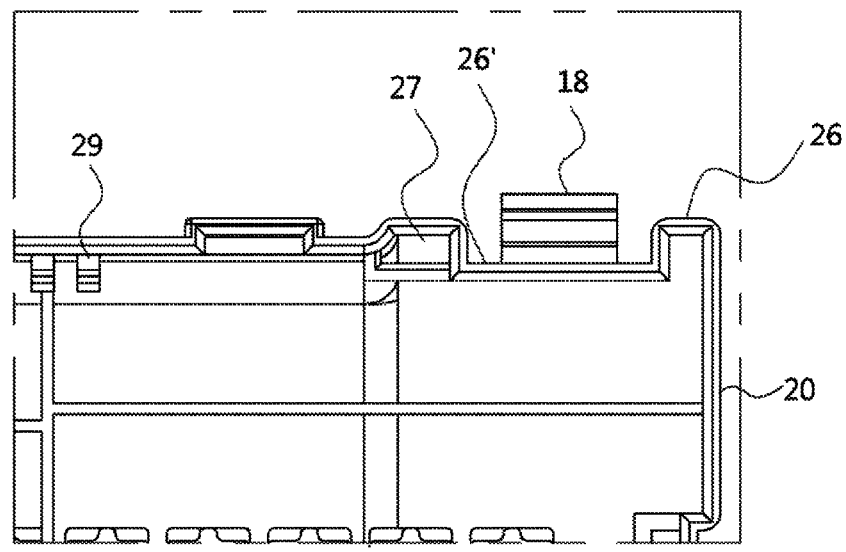
FIG. 5 is a bottom perspective view of a housing cover constituting the board block for vehicles according to the embodiment of the present invention.

As shown in FIG. 5, the spacer channels 27 are grooved on inner surfaces of the housing cover 20 corresponding to the spacer bosses 26. The body ribs 13 are guided by and located in the spacer channels 27. A thickness and a size of the housing cover 20 can be minimized by forming the spacer channels 27 grooved on the inner surface of the housing cover 20 in this way at the locations corresponding to the spacer bosses 26.

The mounting hooks 28 extend long along the inner surfaces of the recesses 26', and ends of the mounting hooks 28 are connected to inner surfaces of the housing cover 20 corresponding to the recesses 26' to be resiliently deformed. A stopping step 28' is formed in each of the mounting hooks 28. The stopping step 28' protrudes from one surface of a tip end of the mounting hook 28 and is stopped by the coupling step 5 formed on the inner surface of the mounting space 3 of the box 1 to mount the board block 10' to the box 1. It is preferable that a free end of the mounting hook 28 protrudes slightly further than the upper surface of the housing cover 20.

Figure 4:
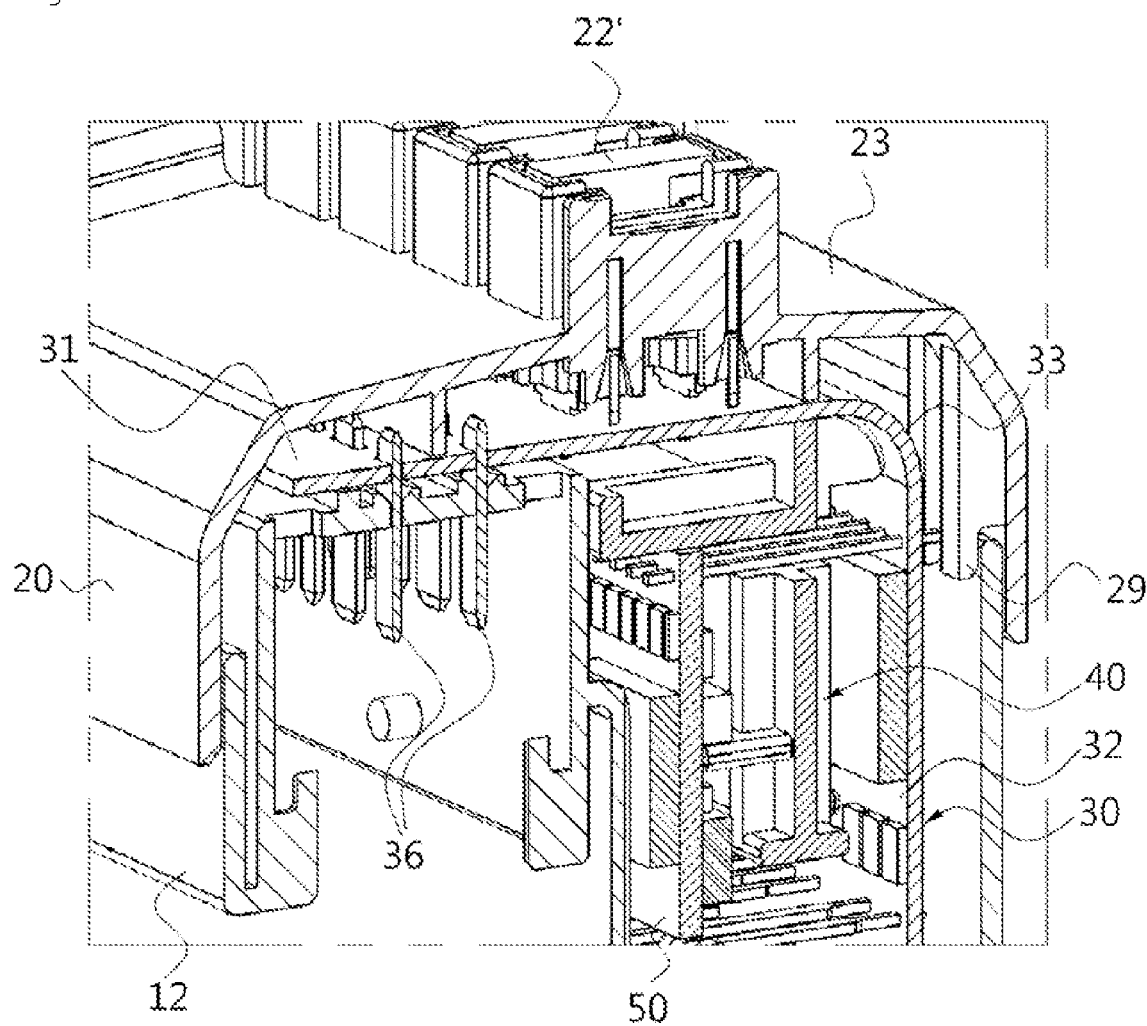
FIG. 4 is a partially sectional perspective view showing a main part of the the board block for vehicles according to the embodiment of the present invention.

Stopping ribs 29 are formed on an inner surface of the housing cover 20. The stopping ribs 29 are shown in FIGS. 4 and 5. The stopping ribs 29 protrude from an inner surface of the housing cover 20, and an aperture is formed between some portions of the stopping ribs 29 and the inner surface of the housing cover 20. An upper end of the housing body 12 is inserted into the aperture, which has a thickness slightly larger than or the same as that of a corresponding portion of the housing body 12.

The first printed circuit board 30 is installed within the housing 10. The first printed circuit board 30 has a metal layer therein. The metal layer is a metal plate, for example, a copper plate. The metal layer formed a frame in the first printed circuit board 30, and serves as a kind of circuit pattern for supply of power. Insulation layers and circuit pattern layers are sequentially stacked on opposite surfaces of the metal layer of the first printed circuit board 30.

The first printed circuit board 30 has a first area 31 facing an inner ceiling of the housing cover 20 and a second area 32 facing an inner surface of the housing body 12. A bending area 33 is provided between the first area 31 and the second area 32. The bending area 33 is an area where the metal layer is exposed to the outside as it is. That is, the bending area 33 is a portion formed only of the metal layer, so the bending area 33 may be bent at a desired angle. In the embodiment of the present invention, the bending area 33 is bent to have a predetermined radius of curvature, and imaginary extension planes of the first area 31 and the second area 32 are perpendicular to each other.

Fuse coupling terminals 34 electrically connected to legs of fuses 22', respectively, are installed at a location of the first area 31 corresponding to the component mounting unit 22. The fuse coupling terminals 34 extend toward the ceiling of the housing cover 20.

First connector terminals 36 are installed on a surface of the first area 31 opposite to the fuse coupling terminals 34. The first connector terminals 36 extend in a direction opposite to the fuse coupling terminals 34, and are located within the first connection unit 16 to be electrically connected to terminals of counterpart connectors coupled to the first connection unit 16.

Meanwhile, a plurality of jumper pins 38 are provided in the second area 32. The jumper pins 38 are adapted to electrically connect a second printed circuit board 50, which will be described below, and the first printed circuit board 30. Ends of the jumper pins 38 are connected to the second area 32 of the first printed circuit board 30, and opposite ends of the jumper pins 38 are connected to the second printed circuit board 50.

The board mounting unit 40 is located between the second area 32 of the first printed circuit board 30 and the second printed circuit board 50, which will be described below, to couple the second area 32 and the second printed circuit board 50 with a predetermined interval. The detailed configuration of the board mounting unit 40 will be described with reference to FIGS. 8 to 10.

The second printed circuit board 50 is mounted to one side of the board mounting unit 40. The second printed circuit board 50 has a square plate shape, and many components are mounted to the second printed circuit board 50. The second printed circuit board 50 is mainly for control, and various chips, which are components for control, are mounted to the second printed circuit board 50. For reference, the first printed circuit board mainly performs a function of controlling power supply.

Meanwhile, a second connection unit 52 is provided such that a tip end of the second connection unit 52 is opened toward a lower side of the interior space 14 of the housing body 12. The second connection unit 52 is installed in the second area 32 of the first printed circuit board 30, and the tip end of the second connection unit 52 is exposed to the lower side of the interior space 12 of the housing body 12 while the second connection unit 52 is installed in the first printed circuit board 30. Thus, the second connection unit 52 protrudes further as the housing body 12 is viewed from the lower side, and the first connection unit 16 is relatively retreated. That is, the first connector terminal 36 of the first connection unit 16 is installed in the first area 31 of the first printed circuit board 30. In this way, a length L (see FIG. 3) of the circuit pattern on the first area 31 related to the first connector terminal 36 may be made relatively short. Reference numeral 54 is a second connector terminal provided in the second connection unit 52.

Figure 8:
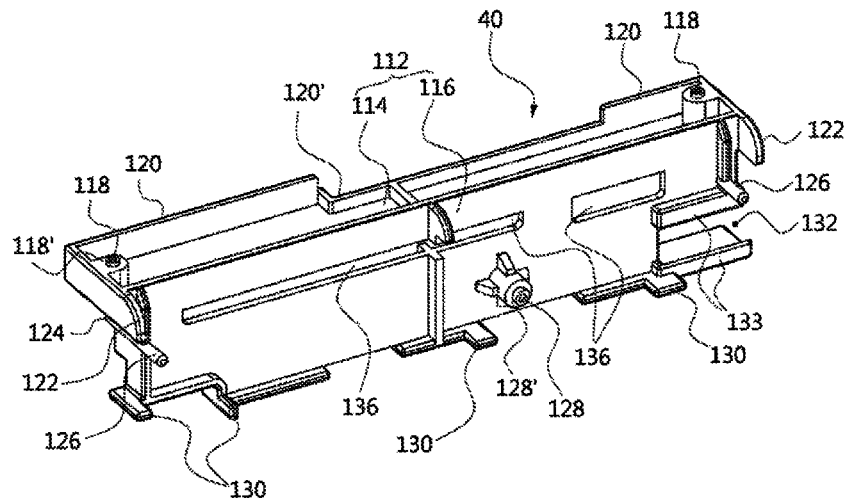
FIG. 8 is a perspective view showing the board mounting unit according to the embodiment of the present invention.
Figure 9:
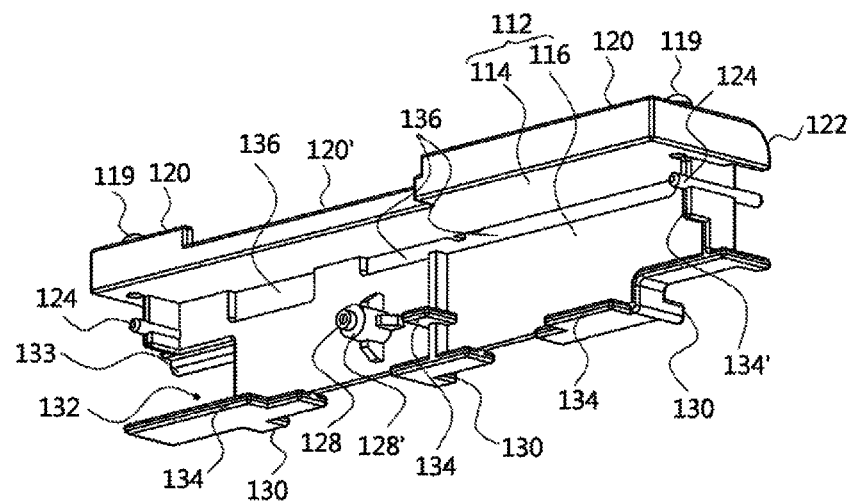
FIG. 9 is a perspective view of the substrate block for vehicles according to the embodiment of the present invention when viewed from another side.
Figure 10:
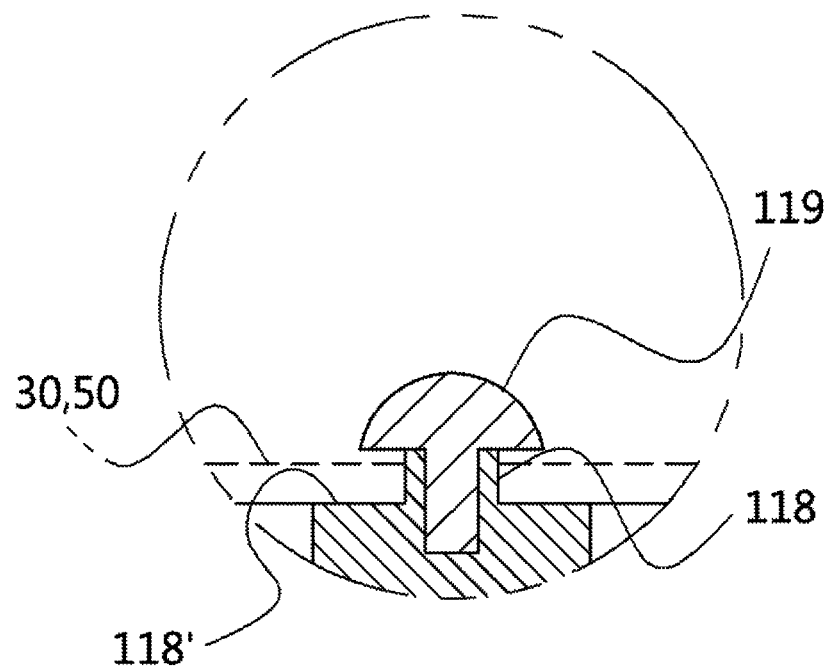
FIG. 10 is a sectional view showing the main part of the the substrate block for vehicles according to the embodiment of the present invention.

Here, a detailed configuration of the board mounting unit 40 will be described. Referring to FIGS. 8 to 10, a body plate 112 formed of a synthetic resin forms an outer appearance and a frame of the board mounting unit 40. In the body plate 112, a first body plate 114 and a second body plate 116 are integrally formed to be perpendicular to each other. The first body plate 114 and the second body plate 116 may not be perpendicular to each other, and should be connected to each other at an angle corresponding to an angle defined by imaginary extension planes of the first area 31 and the second area 32 of the first printed circuit board 30. The first body plate 114 and the second body plate 116 have a rectangular plate shape whose length is longer than a width thereof with reference to FIG. 8.

First fixing members 118 protrude from opposite ends of the first body plate 114, respectively. The first fixing members 118 protrude on positioning steps 118', respectively. Each of the first fixing members 118 corresponds to a cylindrical boss, and a coupling hole (provided with no reference numeral) is formed at a center thereof so that a screw 119 is coupled to the coupling hole. The first fixing members 118 are inserted into coupling holes of the first printed circuit board 30 to be preliminarily assembled.

First positioning ribs 120 protrude along peripheries of the first body plate 114. The first positioning ribs 120 are positioned in the first area 31 of the first printed circuit board 30 to support the first area 31. The first positioning ribs 120 are not formed along the entire periphery of the first body plate 114. In the shown embodiment, the first positioning ribs 120 are formed along the almost entire area, but a communication portion 120' is formed in a section of the area. The communication portion 120' corresponds to a through portion between the first positioning ribs 120. Air flows through the communication portion 120'.

A plurality of curved surface support pieces 122 extend integrally from the first positioning ribs 120 of the first body plate 114. The curved surface support pieces 122 are formed side by side at a predetermined interval. Each of the curved surface support pieces 122 has a curved surface having the same radius as that of the curved surface of the bending area 33 of the first printed circuit board 30. The upper surfaces of the curved surface support pieces 122 and the upper surfaces of the first positioning ribs 120 form a continuous plane. For reference, the curved surface support pieces 122 protrude in a direction perpendicular to a surface of the second body plate 116.

Second board support rods 124 protrude from opposite sides of the second body plate 116, respectively. The second board support rods 124 extend parallel to the first body plate 114, and extend side by side at the opposite ends of the second body plate 116. Opposite ends of the second board support rods 124 correspond to board support rods, respectively. The board support rods 126 and the second board support rods 124 are integrally formed in the embodiment. If the board support rods 126 and the second board support rods 124 are integrally formed in this way, a mold for manufacturing the board mounting unit 40 can be made simple.

Second fixing members 128 extend from opposite surfaces of the second body plate 116 in opposite directions. The second fixing members 128 are formed at locations substantially corresponding to centers of the opposite surfaces of the second body plate 116. The second fixing member 128 protrudes on a positioning step 128'. The second printed circuit board 50 is positioned in the positioning step 128'. Thus, the tip end of the positioning step 128' is located at the same height as that of a second positioning rib 130, which will be described below. A shape and a structure of the second fixing member 128 are the same as those of the first fixing member 118.

A plurality of second positioning ribs 130 are intermittently provided along a periphery of the second body plate 116. The second positioning ribs 130 support the second area 32 of the first printed circuit board 30. Since the second positioning ribs 130 are formed intermittently, many spaces in communication with the outside are formed between the second area 32 and the second body plate 116. The height of the second positioning rib 130 is the same as the height of the positioning step 128', and the height of the board support rod 126 is larger than the height of the second positioning rib 130. The board support rod 126 is higher than the second positioning rib 130 by the thickness of the second area 32 of the first printed circuit board 30.

A component positioning unit 132 is formed at one end of the second body plate 116. For example, an electrolytic condenser may be installed in the component positioning unit 132. Support plates 133 are formed in parallel at opposite ends of the component positioning unit 132. A through space is defined between the support plates 133 to communicate the component positioning unit 132 with the outside. Opposite lengthwise ends of a cylindrical component are positioned on and supported by the support plate 133.

As shown in FIG. 9, third positioning ribs 134 protrude from the second body plate 116 on a side opposite to the second positioning ribs 130. The third positioning ribs 134 are also intermittently formed along a periphery of the second body plate 116. The height of the third positioning ribs 134 are also smaller than the height of the second board support rod 124 by the thickness of the second printed circuit board 50.

Meanwhile, a plurality of communication holes 136 are formed long to pass through the second body plate 116. The jumper pins 38 electrically connecting the second area 32 of the first printed circuit board 30 and the second printed circuit board 50 located on opposite surfaces of the second body plate 116 pass through the communication holes 136. The communication holes 136 are formed to have a long and narrow width in the lengthwise direction of the second body plate 116. The communication holes 136 are not inevitably necessary, and the jumper pins 38 may be insert-molded in the second body plate 116 without formation of the communication holes 136. If the jumper pins 38 are insert-molded, the jumper pins 38 can be installed more easily.

The first, second, and third positioning ribs 120, 130, and 134 of the board mounting unit 40 have thin plate shapes, respectively, and since areas of the first, second, and third positioning ribs 120, 130, and 134 of the board mounting unit 40 contacting the printed circuit boards 30 and 50 can be reduced by the thin plate shapes, it is advantageous in the aspect of utilization of surfaces of the printed circuit boards 30 and 50 or in the aspect of heat radiation.

Hereinafter, assembly and use of the board block for vehicles according to the present invention having the above-described configuration will be described.

Figure 6:
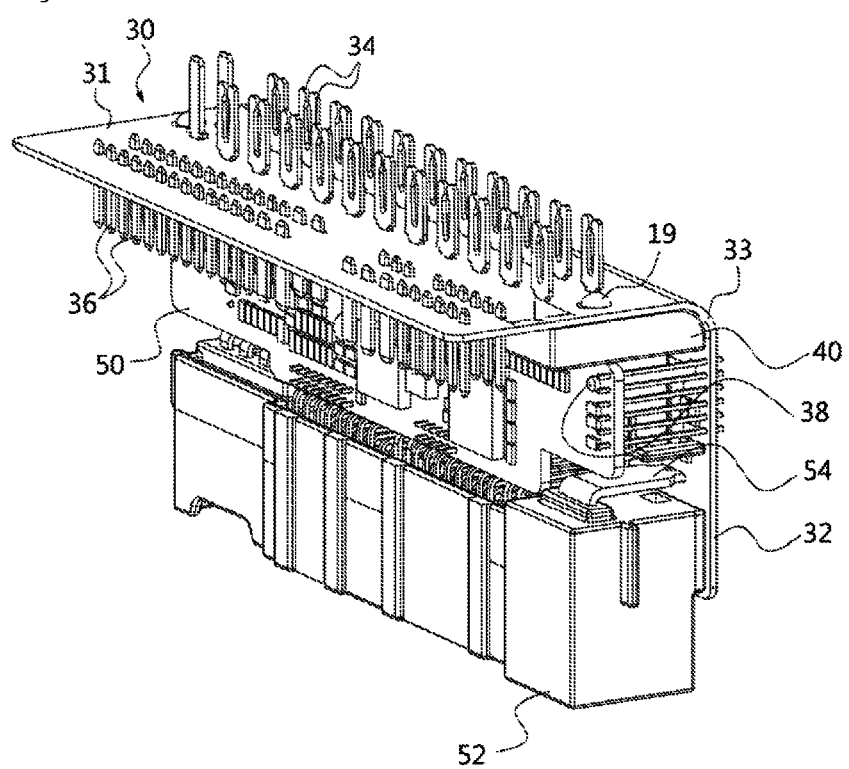
FIG. 6 is a perspective view showing that a first printed circuit board, a second substrate board, a board mounting unit, and a second connection unit constitute one assembly.
Figure 7:
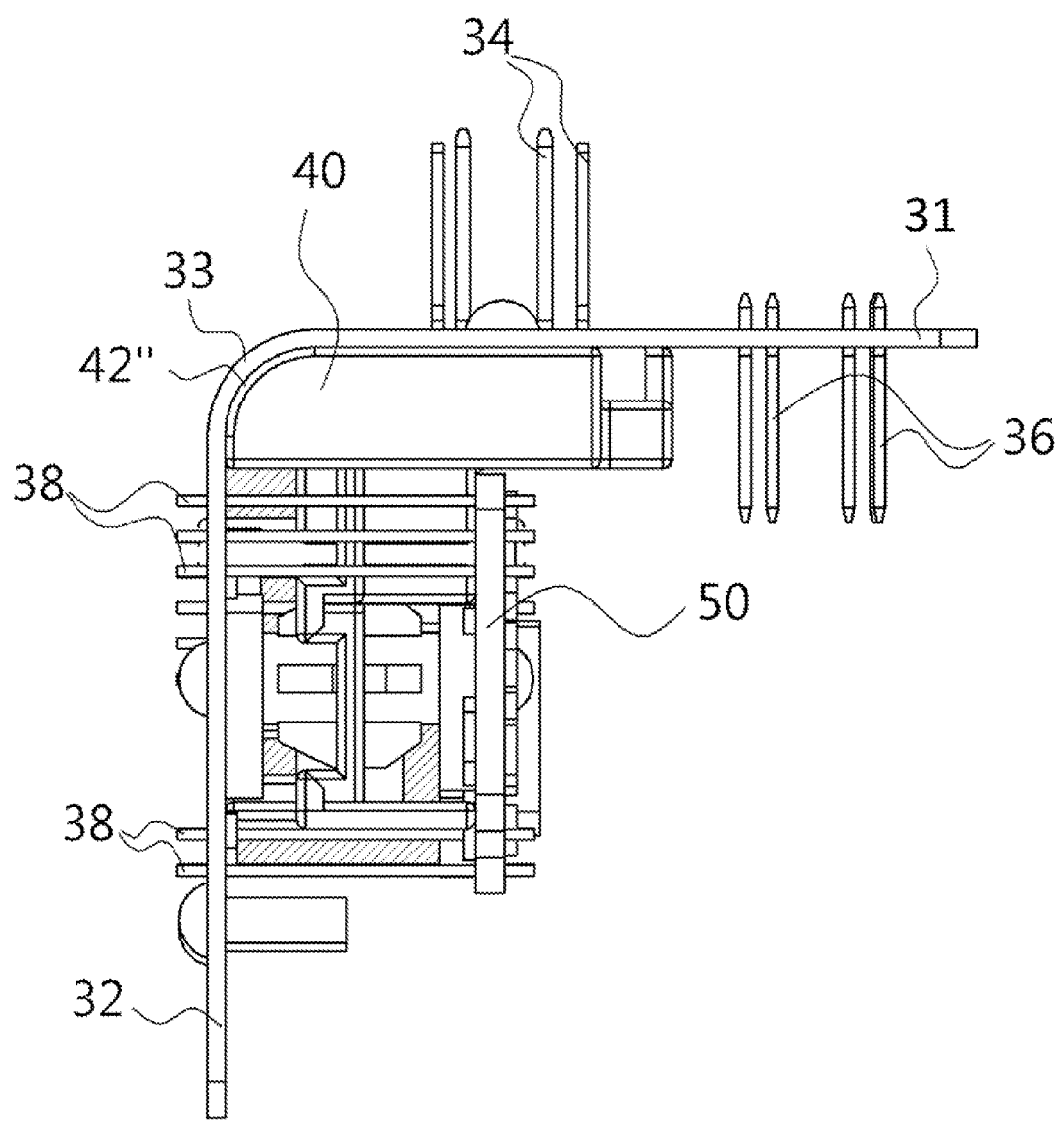
FIG. 7 is a front view showing a space between the board mounting unit and the printed circuit boards through which air flows in the embodiment of the present invention.

As shown in FIG. 6, the first printed circuit board 30, the board mounting unit 40, the second printed circuit board 50, and the second connector terminal 54 constituting the board block 10' of the present invention may be made in one assembly to be supplied to an assembly line.

First, installation of the first printed circuit board 30 in the first body plate 114 and the second body plate 116 of the board mounting unit 40 will be described. The first area 31 of the first printed circuit board 30 is positioned on the first positioning rib 120 protruding along a periphery of one surface of the first body plate 114. Next, the bending area 33 of the first printed circuit board 30 is positioned in the curved surface support pieces 122, and the second area 32 is positioned on the second positioning ribs 130 of the second body plate 116. Then, as the bending area 33 of the first printed circuit board 30 moves toward the curved surface support pieces 122 while the curved surface support pieces 122 and the bending area are spaced apart from each other by a predetermined distance, the first printed circuit board 30 can be positioned on the first body plate 114 and the second body plate 116 at the same time.

In this process, the first fixing members 118 and the second fixing members 128 are inserted into and stopped by the coupling holes (not shown) situated at corresponding locations of the first printed circuit board 30, respectively. The distance between the first fixing members 118 is slightly shorter than the distance between the coupling holes formed in the first printed circuit board 30 to be preliminarily and accurately assembled. Accordingly, the first printed circuit board 30 is assembled in the body plate 112. Of course, for more firm coupling, the screws 119 are coupled to the first fixing members 118 and the second fixing members 128.

When the second area 33 is coupled to the second body plate 116, the board support rods 126 pass through through-holes (provided with no reference numeral) formed in the second area 32 to guide a location where the second area 32 is fixed to the second body plate 116.

Since the first area 31 and the second area 32 of the first printed circuit board 30 are coupled to the first body plate 114 and the second body plate 116 of the board mounting unit 40, respectively, and the curved surface of the bending area 33 is supported by the curved surface support pieces 122 of the board mounting unit 40, the first printed circuit board 30 can maintain its original shape. That is, since the bending area 33 is formed by bending the metal layer formed of a metal, the bending angle of the bending area 33 may become larger due to a spring back phenomenon. However, since the curved surface support pieces 122 support the bending area 33 and the first area and the second area 32 are coupled to the first body plate 114 and the second body plate 116 by the fixing members 118 and 128, the first printed circuit board 30 can maintain its original shape.

Next, the jumper pins 38 are installed in the second area 32 through the communication holes 136. Of course, the jumper pins 38 may be installed in the second area 32 in advance. The jumper pins 38 may be installed in the second printed circuit board 50 in advance. Further, the jumper pins 38 may be integrally formed in the second body plate 116 through insert-molding without formation of the communication holes 136 in the second body plate 116.

The second printed circuit board 50 is mounted to the second body plate 116. The second printed circuit board 50 may be installed at an accurate location by passing the second fixing members 128 through the second printed circuit board 50 and inserting the second board support rods 124 into the through-holes of the second printed circuit board 50. Separate screws may be used to firmly fix the second printed circuit board 50 to the second body plate 116.

For reference, FIG. 6 shows a state in which the first printed circuit board 30, the second printed circuit board 50, the second connection unit 52, and the like are installed in the board mounting unit 40, in which case it can be seen that the first printed circuit board 30 is installed to surround the first body plate 114 and the second body plate 116 of the board mounting unit 40 to make the entire assembly small-sized.

The assembly is shown in FIG. 6, and the second area 32, the board mounting unit 40, and the second printed circuit board 30 are inserted into the interior space 14 of the housing body 12. Then, the first connector terminal 36 located in the first area 31 is inserted into the first connection unit 16 of the housing body 12.

The first area 31 of the first printed circuit board is shielded by coupling the housing cover 20 to the housing body 12. The housing cover 20 is coupled to the housing body 12 by stopping the coupling bosses 18 with the coupling stoppers 24.

If the housing body 12 and the housing cover 20 are coupled to each other, the fuse coupling terminals 34 are located in the component mounting unit 22 of the housing cover 20. Thus, if the fuses 22' are mounted to the component mounting unit 22, the legs of the fuses are coupled to the fuse coupling terminals 34.

Figure 2:
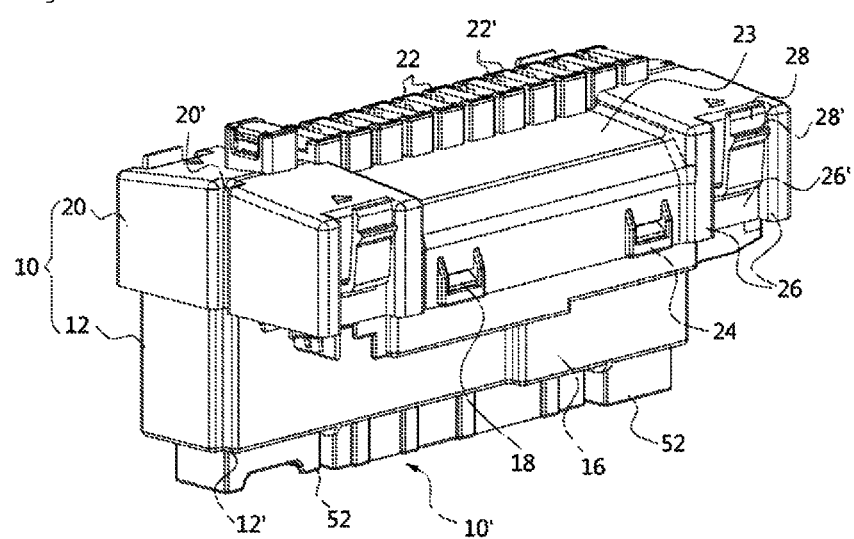
FIG. 2 is a perspective view showing the board block for vehicles according to the embodiment of the present invention.

If the housing body 12 and the housing cover 20 are coupled to each other, the board block 10' is finished as shown in FIG. 2. Next, the fuses 22' are inserted into and mounted to the component mounting unit 22 of the housing cover 20, and corresponding connectors (not shown) are coupled to the first connection unit 16 and the second connection unit 52.

The board block 10' of the present invention may be used as it is, but is generally mounted to the mounting space 3 of the box 1. When the board block 10' is to be mounted to the box 1, the connectors corresponding to the first connection unit 16 and the second connection unit 52, respectively, are coupled after the board block 10' is mounted to the mounting space 3 of the box 1.

When the board block 10' is mounted to the mounting space 3 of the box 1, the spacer bosses 26 formed on the outer surface of the housing 10 are attached to the inner surface of the mounting space 3. Further, the mounting hooks 28 located between the spacer hooks 26 are stopped by the coupling step 5 located in the mounting space 3 of the box 1.

The mounting hook 28 is guided by the coupling step 5 located in the mounting space 3 of the box 1 to be resiliently deformed, and is restored to the original shape if the stopping step 28' passes by the coupling step 5 so that the coupling step 5 is stopped by the stopping step 28'. In this state, a periphery of a lower end of the housing cover 20 is positioned by the support step 7.

The guide ribs 9 are located in the guide channels 12' and 20' in the process of inserting the board block 10' into the mounting space 3. The guide ribs 9 cooperate with the guide channels 12' and 20' to insert and guide the board block 10' in an accurate direction. Further, when the board block 10' is inserted into the mounting space 3, the guide ribs 9 are located in the guide channels 12' and 20' to prevent relative movement of the board block 10'.

The outer surfaces of the spacer bosses 26 may be attached to the inner surface of the mounting space 3 and the coupling stoppers 24 may also be attached to the inner surface of the mounting space 3 at the same time. In this way, relative movement of the board block 10' can be prevented as the board block 10' contacts the mounting space 3 of the box 1 in a relatively wide area.

While the board block 10' is mounted to the mounting space 3 of the box 1 in this way, the housing body 12 is not directly coupled to the box 1. However, since the body ribs 13 of the housing body 12 are located in the spacer channels 27 of the housing cover 20 and the coupling stoppers 24 of the housing cover 20 are coupled to the coupling bosses 18 of the housing body 12, they can be coupled to each other more firmly.

The structure by which the housing cover 20 is coupled to the housing body 12 may have more various forms in addition to the above-described one. However, the reason why the coupling step 21 protrudes by the same degree as the spacer bosses 26 is because a contact area between the board block 10' and the inner surface of the mounting space 3 can be increased relatively and a size and a thickness of the housing cover 20 can be reduced by forming the spacer channels 27 on the inner surface of the housing cover 20 corresponding to the spacer bosses 26.

Next, a process of separating the board block 10' from the mounting space 3 of the box 1 is as follows. First, the stopping step 28' is separated from the coupling step 5 to be raised slightly by resiliently deforming the mounting hooks 28 and attaching the mounting hooks 28 to inner surfaces of the recesses 26'. In this way, the component mounting unit 22 of the housing cover 20 is held by hands while the mounting hooks 28 are resiliently deformed and the stopping step 28' is separated from the coupling step 5.

Since the inclined surfaces 23 are formed on the upper surface of the housing cover 20 corresponding to a periphery of the component mounting unit 22, the component mounting unit 22 protrudes further to be easily held by fingers of an operator.

Meanwhile, apertures are formed between the outer surface of the board block 10' and the inner surface of the mounting space 3. In particular, the apertures are formed at portions other than the spacer bosses 26 corresponding to the upper portion of the support step 7 and the contact portion between the coupling stoppers 24 and the inner surface of the mounting space 3, whereby heat generated from the board block 10' can be smoothly emitted to the outside through the apertures.

As described above, the connectors corresponding to the first connection unit 16 and the second connection unit 52 are coupled to the board block 10'. When the board block 10' is mounted to the box 1 to be used, the corresponding connectors may be coupled after the board block 10' is mounted to the box 1.

Since the positioning ribs 120, 130, and 134 of the board mounting unit 40 have thin plate shapes and are intermittently formed along the peripheries of the first body plate 114 and the second body plate 116, the area where the printed circuit directly contacts the board mounting unit 40 is reduced, making it possible to discharge the heat generated by the printed circuit boards 30 and 50 better.

The scope of the present invention is not limited to the above-described embodiment but defined by the claims, and it is apparent that those skilled in the art to which the present invention pertains can variously modify and revise the present invention without departing from the scope of the present invention.

For example, the second area 32 and the second printed circuit board 50 are electrically connected to each other by the jumper pins 38 in the embodiment. However, wires or flexible cables may be used instead of the jumper pins 38.

Although it has been described in the embodiment that the metal layer is present in the first printed circuit board 30, the metal layer may be provided in the interior or on the outer surface of the first printed circuit board 30.

Although it has been described that the second printed circuit board 50 faces the second area 32 of the first printed circuit board 30, the second printed circuit board 50 may be adjacent to the second area 32 and the relationship between the second printed circuit board 50 and the second area 32 may have various forms. Further, the second printed circuit board 50 is not inevitably necessary, and when the second printed circuit board 50 is not present, the board mounting unit 40 also is not inevitably necessary.

The first connection unit 16 and the second connection unit 52 are opened in the same direction in the shown embodiment, which is not inevitably necessary. The connection units 16 and 52 may be opened in different directions.

Further, although it has been described in the shown embodiment that the spacer bosses 26 and the coupling stoppers 24 are attached to the inner surface of the mounting space 3 at the same time, only the spacer bosses 26 and the outer surface of the housing cover 20 in which the guide channels 20' are formed may be attached to the inner side of the mounting space 3, and the coupling stopper 24 may not. Of course, a movement preventing effect can be further increased by attaching the coupling stoppers 24 to the inner surface of the mounting space 3.

The guide ribs 9 and the guide channels 12' and 20' are not inevitably necessary, and may not be used when the insertion direction of the housing cover 20 can be guided by the shape of the housing 10 itself.

Although it has been described in the shown embodiment that the housing 10 is separated into the housing body 12 and the housing cover 20, the housing cover 20 has substantially all the configurations for coupling to the box 1, so the housing cover 20 can be substantially considered as the housing 10.

Although it has been described in the shown embodiment that the second connection unit 52 is installed in the second area 32 of the first printed circuit board 30 to be exposed to a lower side of the housing body 12, the second connection unit 52 may be installed in the second printed circuit board 50.

The body plate 112 including the first body plate 114 and the second body plate 116 may not have the shown shape. That is, although the first body plate 114 and the second body plate 116 have rectangular plate shapes and integrally formed to be perpendicular to each other, the shapes of the plates and their connection angles may be varied.

The invention claimed is:

1. A board block for vehicles, comprising:
a housing having an interior space;
a first printed circuit board installed in the interior space of the housing, having a first area disposed in a first direction, a second area disposed in a second direction perpendicular to the first direction, a bending area connecting the first area and the second area, and a metal layer formed of a metal, wherein the first area, the second area, and the bending area are formed as a unitary body;
a first connection unit installed in the first area of the first printed circuit board, and opened to the outside of the housing for electrical connection of the first area of the first printed circuit board to the outside; and
a second connection unit installed in the second area of the first printed circuit board and opened to the outside of the housing for electrical connection of the second area of the first printed circuit board to the outside.

2. The board block as claimed in claim 1, wherein the housing includes a housing body and a housing cover, and wherein the housing body has the interior space where the second area of the first circuit board is formed and the housing cover covers and shields an upper end of the housing body.

3. The board block as claimed in claim 2, wherein the first printed circuit board is installed in a board mounting unit such that the first area thereof faces a ceiling of the housing cover and the second area thereof faces an inner surface of one side of the housing body.

4. The board block as claimed in claim 3, wherein a component mounting unit within which component coupling terminals installed in the first area of the first printed circuit board are located protrudes from an upper surface of the housing cover, and the upper surface of the housing cover corresponding to opposite sides of the component mounting unit forms inclined surfaces which are inclined downward toward opposite sides of the housing cover.

5. The board block as claimed in claim 4, wherein the first connection unit is provided at one side of an upper end of the housing body and the second connection unit is provided at a lower end of the housing body such that the first connection unit is retreated from the second connection unit with respect to a lower side of the housing body.

6. The board block as claimed in claim 1, further comprising a second printed circuit board installed adjacent to the second area, wherein the second printed circuit board is mounted to a board mounting unit together with the first printed circuit board.

7. The board block as claimed in claim 6, wherein a body plate forming a frame of the board mounting unit includes a first body plate and a second body plate integrally formed to have a predetermined angle therebetween, and wherein the first area of the first printed circuit board is mounted to the first body plate, the second area of the first printed circuit board is mounted to one side surface of the second body plate, and the second printed circuit board is mounted to an opposite side surface of the second body plate.

8. A board block for vehicles, comprising:
a housing including a housing body having an interior space and a housing cover for shielding an upper end of the housing body;
a first printed circuit board having a first area disposed in a first direction, a second area disposed in a second direction perpendicular to the first direction, a bending area connecting the first area and the second area, and a metal layer formed of a metal, wherein the second area is located in the interior space of the housing body, wherein the first area, the second area, and the bending area are formed as a unitary body;
a first connection unit installed in the first area of the first printed circuit board for electrical connection of the first area to the outside of the housing; and a second connection unit installed in the second area of the first printed circuit board for electrical connection of the first area to the outside of the housing.

9. The board block as claimed in claim 8, further comprising a second printed circuit board installed adjacent to the second area of the first printed circuit board.

10. The board block as claimed in claim 9, further comprising a board mounting unit located between the first area and the second area of the first printed circuit board to secure an interval therebetween.

11. The board block as claimed in claim 8, wherein a tip end of the first connection unit faces a lower side of the housing, and a tip end of the second connection unit faces in the same direction as that of the tip end of the first connection unit.

12. The board block as claimed in claim 11, wherein the first connection unit is provided at one side of an upper end of the housing body and the second connection unit is provided at a lower end of the housing body such that the first connection unit is retreated from the second connection unit with respect to a lower side of the housing body.

13. The board block as claimed in claim 12, wherein the first printed circuit board is installed in a board mounting unit such that the first area thereof faces a ceiling of the housing cover and the second area thereof faces an inner surface of one side of the housing body.

14. The board block as claimed in claim 13, wherein a component mounting unit within which component coupling terminals installed in the first area of the first printed circuit board are located protrudes from an upper surface of the housing cover, and the upper surface of the housing cover corresponding to opposite sides of the component mounting unit forms inclined surfaces which are inclined downward toward opposite sides of the housing cover.

15. A board block for vehicles, comprising:
a housing including a housing body having an interior space and a housing cover for shielding an upper end of the housing body;
a first printed circuit board located in the interior space of the housing body and having a first area disposed in a first direction, a second area disposed in a second direction perpendicular to the first direction, and a bending area connecting the first area and the second area, wherein the first area, the second area, and the bending area are formed as a unitary body;
a second printed circuit board facing the second area at a predetermined interval;
a board mounting unit located between the first area and the second area of the first printed circuit board to secure an interval therebetween;
a first connection unit installed in the first area of the first printed circuit board for electrical connection of the first area to the outside of the housing; and
a second connection unit for electrical connection of the first area to the outside of the housing, having a tip end which faces in a direction in which a tip end of the first connection unit faces.

16. The board block as claimed in claim 15, wherein a metal layer formed of a metal is formed in the first printed circuit board and the metal layer is exposed to the outside in the bending area.

17. The board block as claimed in claim 15, wherein the second connection unit is installed in the second area of the first printed circuit board.

18. The board block as claimed in claim 17, wherein the first connection unit is provided at one side of an upper end of the housing body and the second connection unit is provided at a lower end of the housing body such that the first connection unit is retreated from the second connection unit with respect to a lower side of the housing body.

19. The board block as claimed in claim 18, wherein the first printed circuit board is installed in the board mounting unit such that the first area thereof faces a ceiling of the housing cover and the second area thereof faces an inner surface of one side of the housing body.

\* \* \* \* \*